(12) United States Patent
Lien et al.

(10) Patent No.: US 7,872,702 B2
(45) Date of Patent: Jan. 18, 2011

(54) FLEXIBLE PRINTED CIRCUIT BOARD AND LIQUID CRYSTAL DISPLAY WITH THE FLEXIBLE PRINTED CIRCUIT BOARD

(75) Inventors: Chih-Hsien Lien, Taichung County (TW); Chin-Wen Lo, Taichung (TW); Yu-Jen Tsai, Taichung County (TW)

(73) Assignee: Wintek Corporation, Taichung (TW)

( * ) Notice: Subject to any disclaimer, the term of this patent is extended or adjusted under 35 U.S.C. 154(b) by 921 days.

(21) Appl. No.: 11/798,213

(22) Filed: May 11, 2007

(65) Prior Publication Data
US 2007/0263998 A1 Nov. 15, 2007

(30) Foreign Application Priority Data
May 12, 2006 (TW) .............................. 95116983 A

(51) Int. Cl.
*G02F 1/1333* (2006.01)
(52) U.S. Cl. .......................... 349/58; 174/254; 361/749

(58) Field of Classification Search ............. 349/58–60; 174/254; 361/748–751
See application file for complete search history.

(56) References Cited

U.S. PATENT DOCUMENTS

| | | | | |
|---|---|---|---|---|
| 6,894,738 B2 * | 5/2005 | Kasuga | ........................ | 349/58 |
| 6,930,734 B2 * | 8/2005 | Lee | ............... | 349/58 |
| 6,937,464 B2 * | 8/2005 | Adams et al. | ............ | 361/679.3 |

* cited by examiner

*Primary Examiner*—Jeremy C Norris
(74) *Attorney, Agent, or Firm*—Muncy, Geissler, Olds & Lowe, PLLC

(57) ABSTRACT

The present invention provides a liquid crystal display module including housing, a flexible printed circuit board and a plurality of electric devices. The housing has at least a receiving notch. The flexible printed circuit board has a flexible substrate and at least an extension substrate projected from the flexible substrate to mount electric devices thereon. The extension substrate may be bent and received in the receiving notch of the housing to achieve the purpose of mounting more electric device on the flexible printed circuit board without having to increase the size of module.

10 Claims, 10 Drawing Sheets

FLEXIBLE PRINTED CIRCUIT BOARD AND LIQUID CRYSTAL DISPLAY WITH THE FLEXIBLE PRINTED CIRCUIT BOARD

BACKGROUND OF THE INVENTION

1. Field of the Invention

The invention relates generally a liquid crystal display (LCD) module, and more particularly to a LCD module equipped with a flexible circuit board, wherein the flexible circuit board may be provided with more electric devices thereon.

2. Description of the Related Art

FIG. 1 and FIG. 2 show a conventional LCD module including a rectangular housing 1, a flexible printed circuit board (FPC) 2 and a plurality of electric devices 3. The housing 1 is mounted with an optical assembly 4 including a liquid crystal panel, a light guide extension substrate and optical films. The FPC 2 has a signal input terminal 2a and a signal output terminal opposite to the signal input terminal 2a and electrically connected to the liquid crystal panel (not shown). The electric devices 3, including LED 3a, passive devices 3b, such as resistances and inductances etc., are mounted on the FPC 2. These electric devices 3 usually are distributed on a side of the FPC 2 and projected from the side. To save the space, these electric devices 3 are provided at the same side as possible.

SUMMARY OF THE INVENTION

The primary objective of the present invention is to provide a flexible printed circuit board and a liquid crystal display module with the flexible printed circuit board, wherein the flexible printed circuit board may be mounted with more electric devices thereon without having to increase the size of the module.

The secondary objective of the present invention is to provide a flexible printed circuit board, which has at least an extension substrate at an edge of the flexible substrate to increase the mounting space for electric devices.

According to the objectives of the present invention, a flexible printed circuit board includes a flexible substrate and at least an extension substrate. The flexible substrate has a signal input terminal on an edge, a signal output terminal on an edge opposite to the signal input terminal and a first mounting region to mount electric devices thereon. The extension substrate is projected from an edge of the flexible substrate without the signal input terminal and the signal output terminal, and a second mounting region is provided on the extension substrate to mount electric devices thereon.

The invention further provides a liquid crystal display module includes a housing and a flexible printed circuit board. The housing has an enclosed outer circumference, on which at least a receiving notch is provided. The flexible printed circuit board has a flexible substrate and at least an extension substrate. The flexible substrate is mounted on the housing with the extension substrate received in the receiving notch. The invention may further include an outer housing coupled to the housing. The outer housing has a lateral plate attached on the extension substrate to protect it.

DETAILED DESCRIPTION OF THE INVENTION

Figure 1:
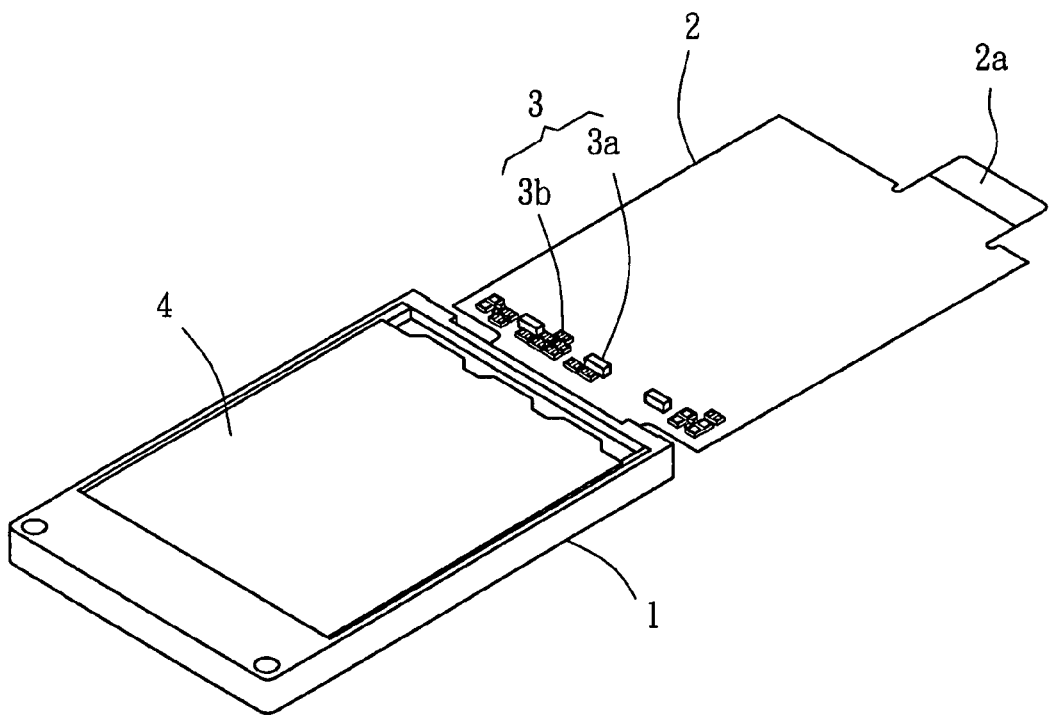
FIG. 1 is an exploded view of the conventional LCD module.
Figure 2:
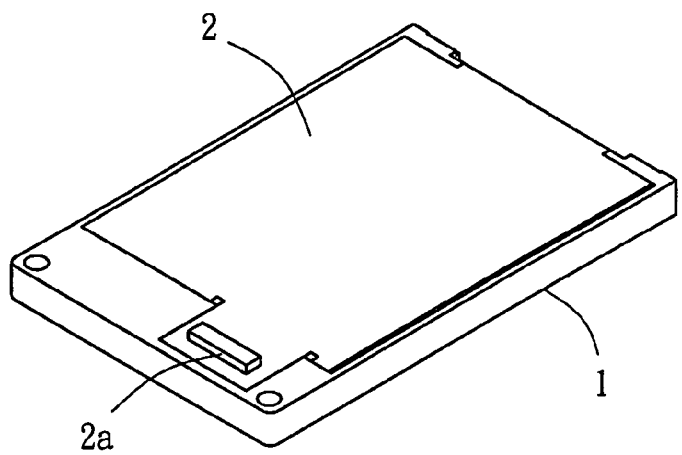
FIG. 2 is a combinative perspective view of the conventional LCD module.
Figure 3:
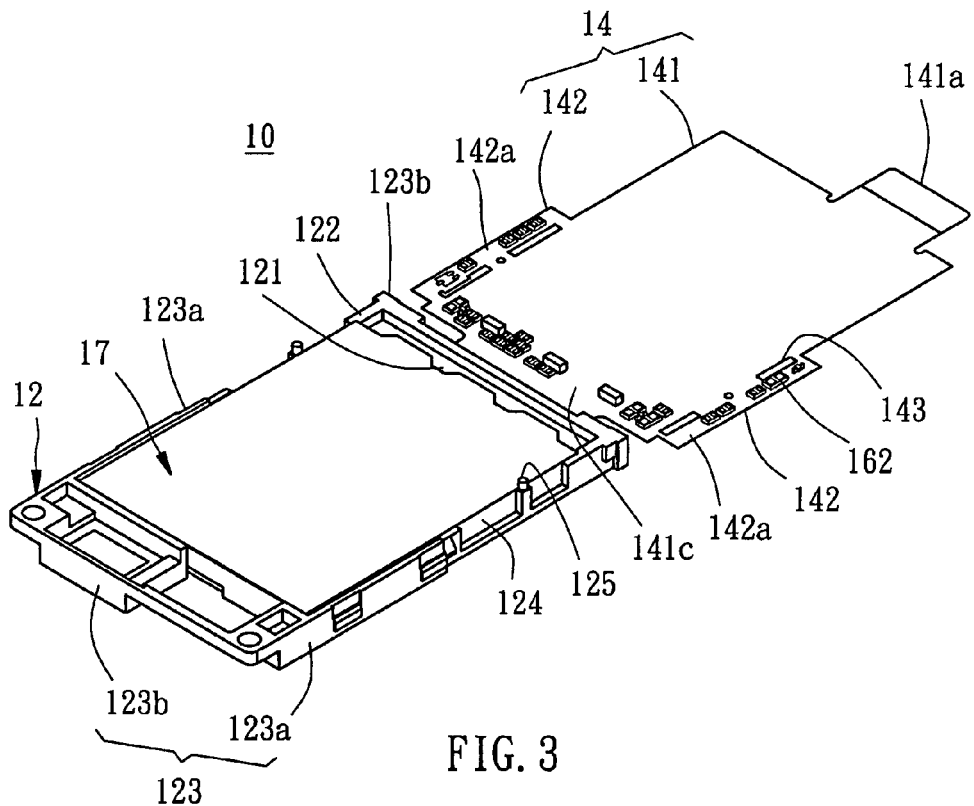
FIG. 3 is an exploded view of the LCD module of a first preferred embodiment of the present invention.
Figure 4:
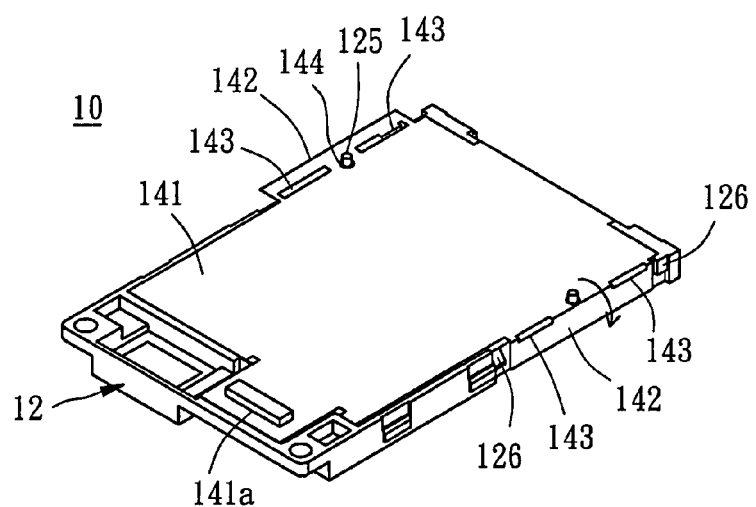
FIG. 4 is a combinative perspective view of FIG. 3.
Figure 5:
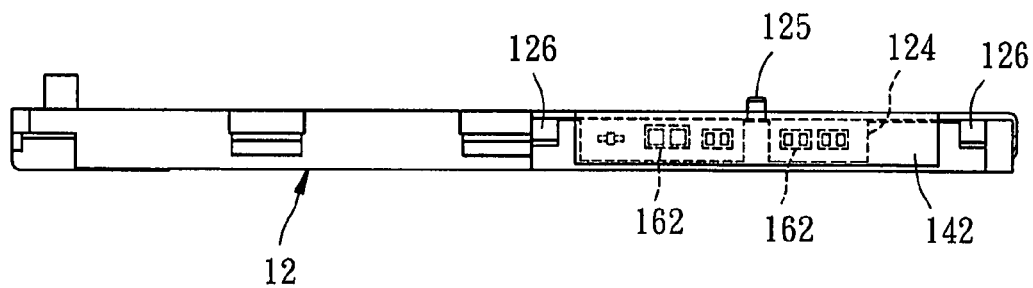
FIG. 5 is a lateral view of FIG. 4.

As shown in FIGS. 3 to 5, a liquid crystal display (LCD) module 10 of the first preferred embodiment of the present invention includes a housing 12, a flexible printed circuit board (FPB) 14 and a plurality of electric devices 16.

The housing 12 is rectangular, in which an optical assembly 17, including a liquid crystal panel, a light guide plate and optical films for example, is mounted therein. A space 121 is left between the housing 12 and the optical assembly 17.

The housing 12 of the invention has a top side 122 and an enclosed outer circumference 123 substantially perpendicular to the top side 122. The outer circumference 123 includes two long sides 123a and two short sides 123b. Each of the long sides 123a is provided with a receiving notch 124 and a position pin 125 in the receiving notch 124. The position pins 125 have tops that are higher than the top side 122 of the housing 12.

Figure 6:
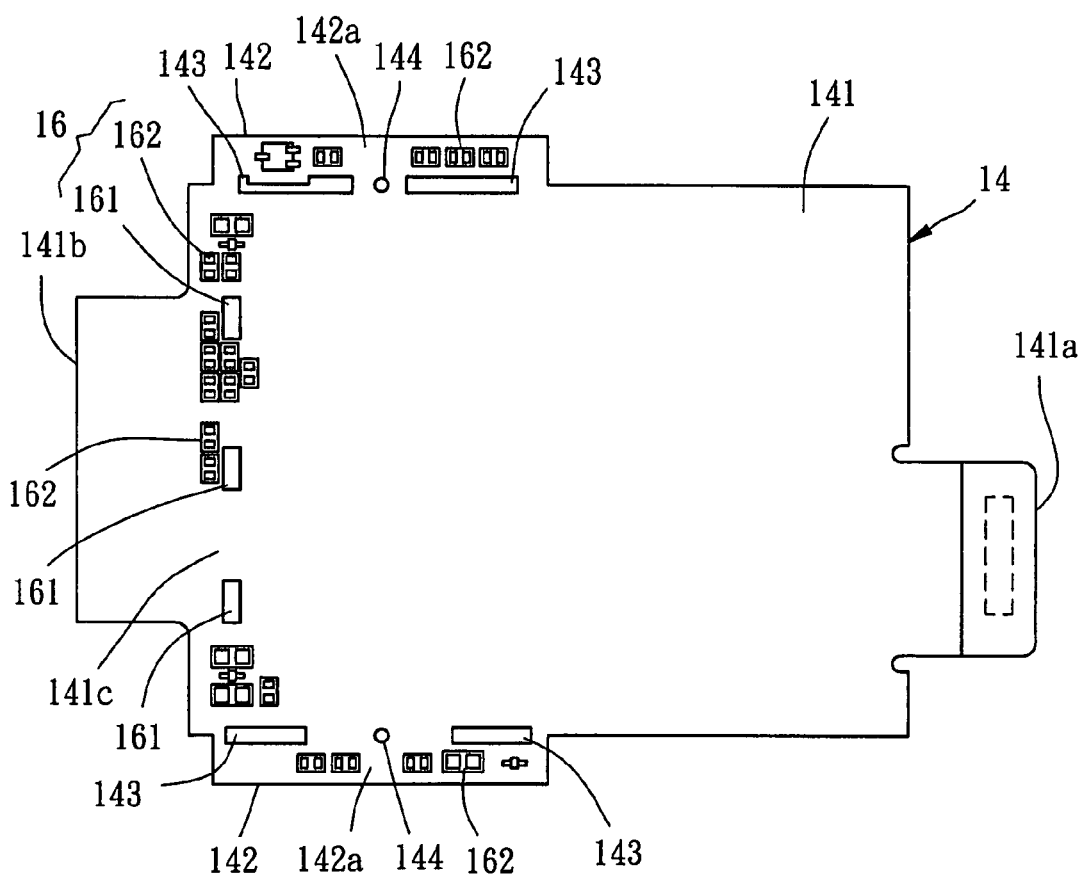
FIG. 6 is a front view of the FPB of FIG. 3.
Figure 7:
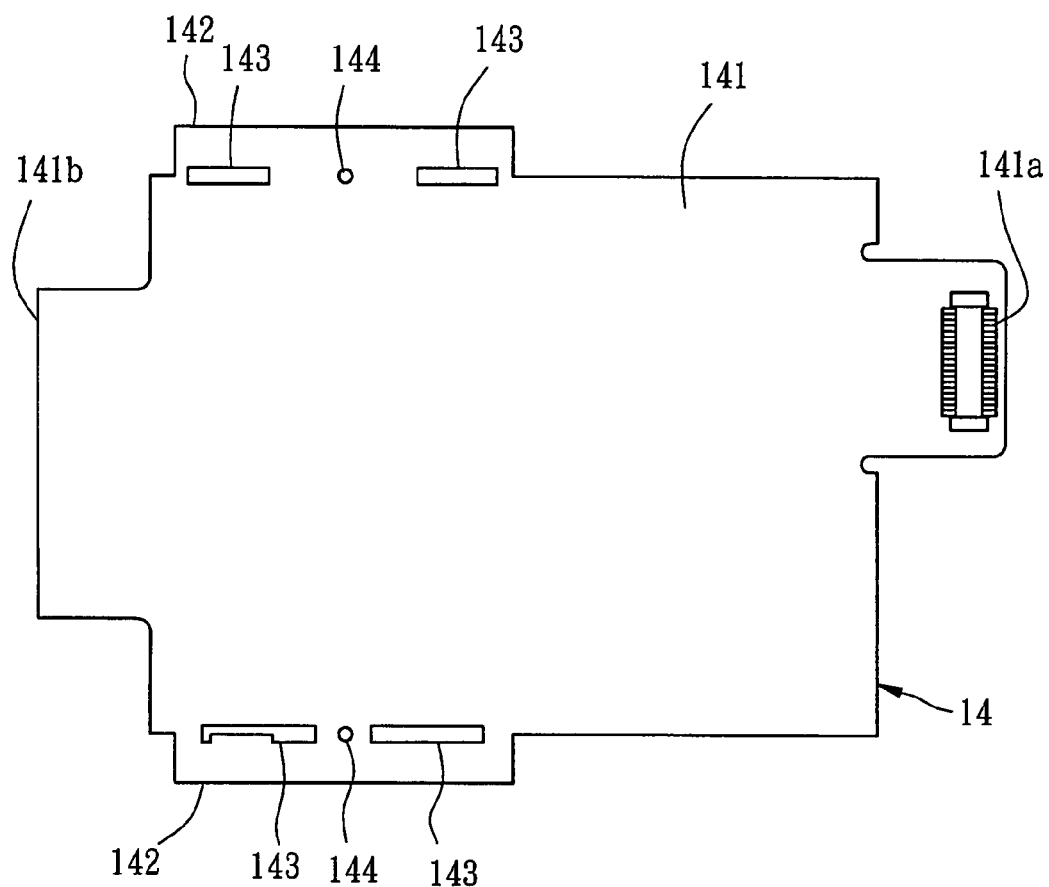
FIG. 7 is a rear view of FIG. 6.

As shown in FIG. 6 and FIG. 7, the FPB 14 includes a flexible substrate 141 and two extension substrates 142.

The flexible substrate 141 has a signal input terminal 141a and a signal output terminal 141b. The signal input terminal 141a is a connector to electrically connect electric members, such as PCB. The signal output terminal 141b is electrically connected to the liquid crystal panel (not shown) in the housing 12. The flexible substrate 141 has a first mounting region 141c on a front side thereof adjacent to the signal output terminal 141b to mount some of the electric devices 16 thereon. The electric devices 16 may be LEDs or passive devices. FIG. 6 shows the electric devices 16 including three LEDs 161 and passive devices 162, such as resistances and inductances.

The extension substrates 142, which are flexible plates, are projected from opposite long edges of the flexible substrate 141. In other words, the extension substrates 142 are located on the edges different from that of the signal input terminal 141a and the signal output terminal 141b. Each of the extension substrates 142 has a second mounting region 142a on a front side thereof to mount passive devices 162, such as resistances and inductances, thereon. The FPB 14 has two elongated openings 143 and a round position bore 144 at each of a junction of the flexible substrate 141 and the extension substrates 142 respectively. The openings 143 may reduce the spring force of the extension substrates 142 when the extension substrates 142 are bent.

To assemble the FPB 14 of the invention, the flexible substrate 141 is flipped on the top side 122 of the housing 12 with the position pins 125 inserted into the position bores 144 to position the flexible substrate 141 on the housing 12 without the chance of swinging. At the same time, the electric devices 16 on the first mounting region 141c are received in the space 121 to have the flexible substrate 141 attached on the optical assembly 12. Next, the extension substrates 142 are bent for a predetermined angle, such as ninety degrees, to receive the passive devices 162 on the second mounting regions 142 in the receiving notches 124 of the housing 12 respectively. As shown in FIG. 5, the LCD module 10 of the present invention is completed.

In above description, you may find that the invention provides the extension substrates 142 on the opposite edges of the flexible substrate 141 to increase the space for mounting more electric devices 16 that may meet the requirement of multifunction electric product. The present invention also provides the extension substrates 142 received in the receiving notches 124 of the housing 12 when the extension substrates 142 are bent that makes the extension substrates 142 not higher than the outer circumference 123 of the housing 12. In other words, the present invention improves the structure of housing and FPB 14 without the size increase of the LCD module 10 to achieve the purpose of having more electric devices 16 mounted.

Figure 8:
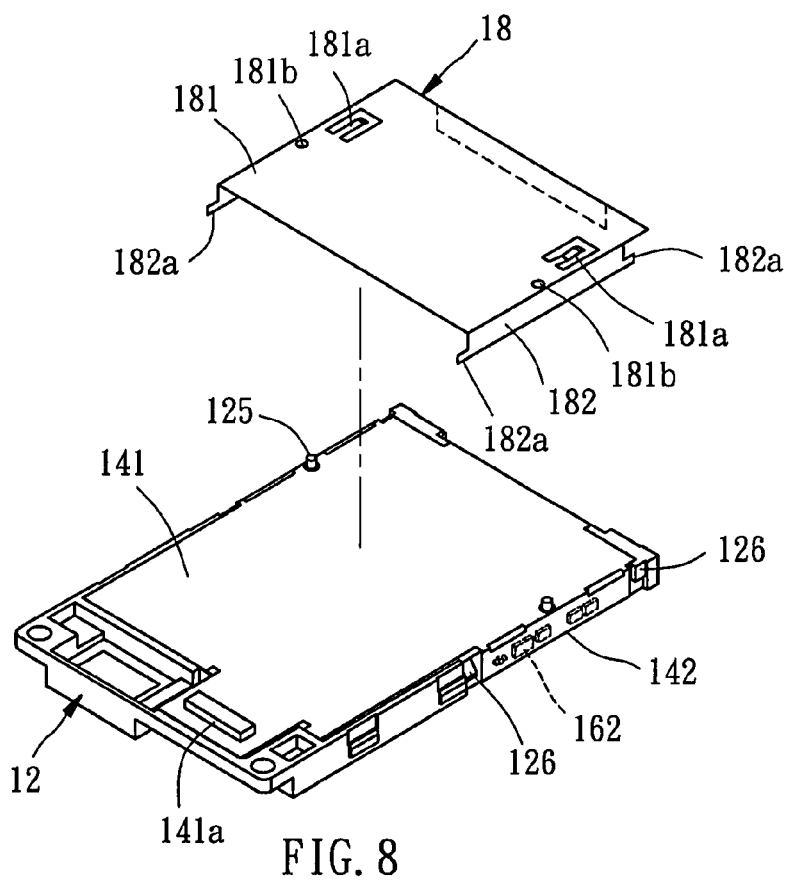
FIG. 8 and FIG. 9 show the LCD module of FIG. 4 mounted in the housing.
Figure 9:
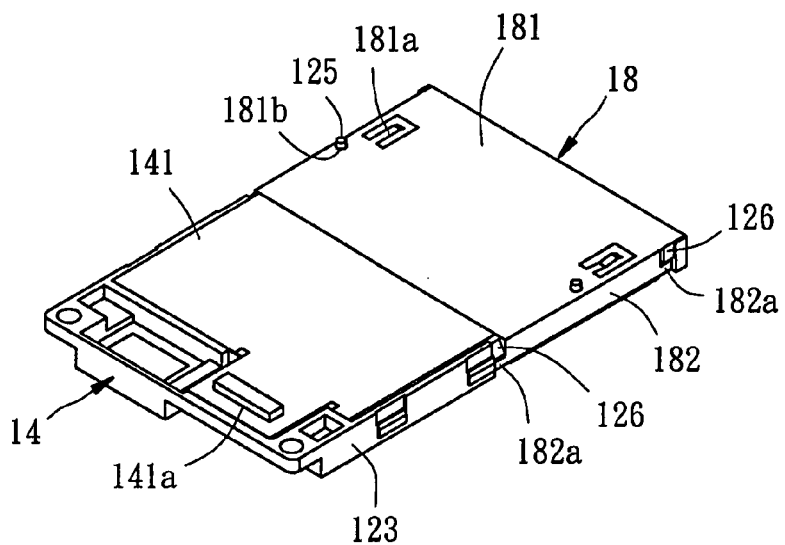

In addition, the housing 12 of the LCD module 10 is provided with two lock blocks 126 on the long sides 123a beside the receiving notches 124 to make sure the flexible substrate 141 and the extension substrates 142 attached on the housing 12. The LCD module 10 may further provide an outer housing 18, as shown in FIG. 8 and FIG. 9. The outer housing 18, which is made by forging to be an up-side-down U-shaped member, has a top extension substrate 181 and two lateral plates 182 on opposite edges of the top extension substrate 181. The top extension substrate 181 has two elastic pieces 181a and two through holes 181b made by forging as well. Each of the lateral plates 182 has a lock leg 182a projected from a bottom end thereof.

The outer housing 18 is coupled to the housing 12 firmly by means of inserting the position pins 125 into the through holes 181b and locking the lock legs 182a of the lateral plates 182 with the lock blocks 126 of the housing 12. At this condition, the top extension substrate 181 of the outer housing 18 is attached on the flexible substrate 141. The elastic pieces 181a press the flexible substrate 141 to fix the flexible substrate 141 firmly and prevent the flexible substrate 141 from warp. The lateral plate 182 of the outer housing 18 have the function of pressing the extension substrates 142 to prevent them from ejecting back and protecting the passive devices 162 of the second mounting regions 142a.

Figure 10:
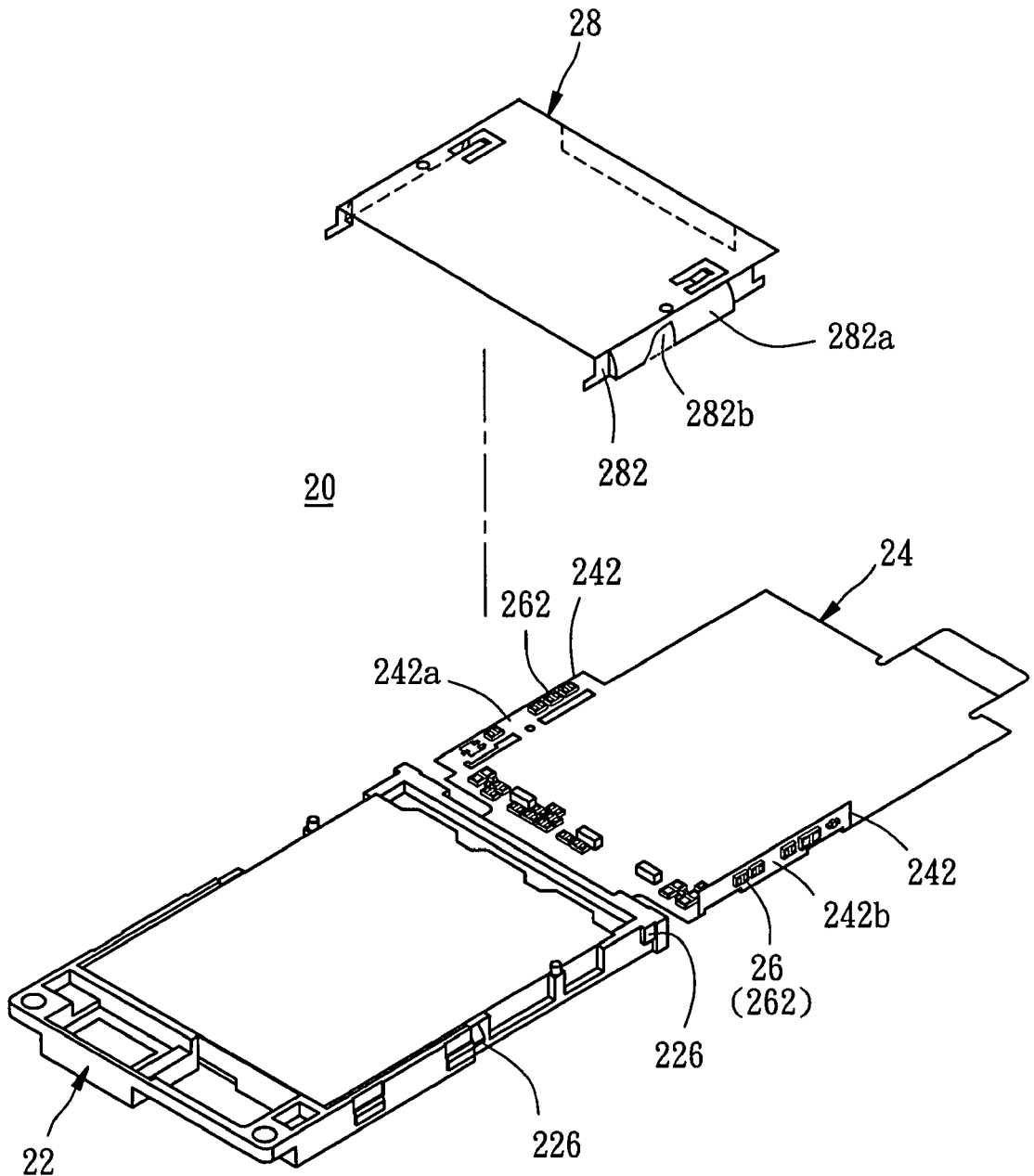
FIG. 10 and FIG. 11 are exploded views of the LCD module of a second preferred embodiment of the present invention.
Figure 11:
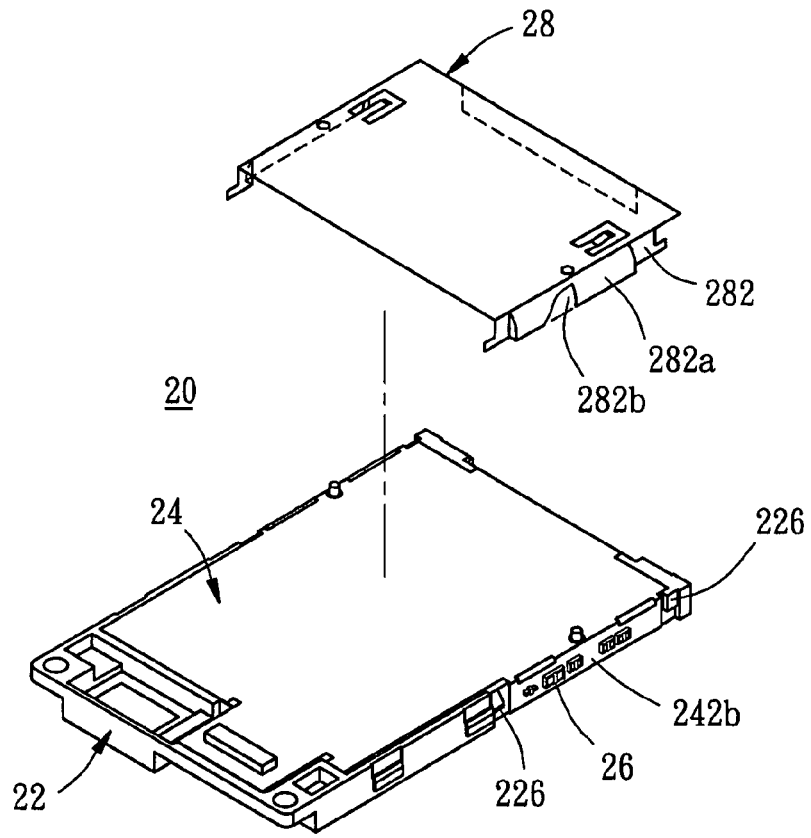
Figure 12:
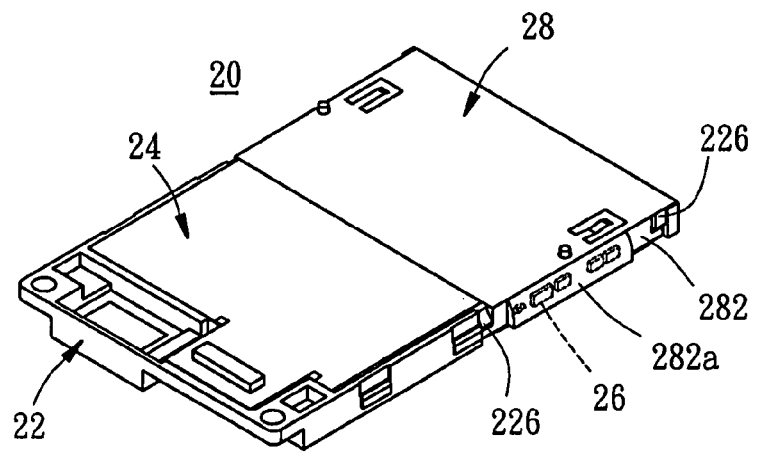
FIG. 12 is a combinative perspective view of FIG. 11.

Above are the descriptions of the LCD module of the first preferred embodiment of the present invention. There are many alternate structures with the same principle of the present invention, and they are described hereunder:

As shown in FIGS. 10 to 12, a LCD module 20 of the second preferred embodiment of the invention, which is similar to the first preferred embodiment, includes a housing 22, a FPB 23, a plurality of electric devices 26 and an outer housing 28. The different parts of the second preferred embodiment are described hereunder:

The FPB has two extension substrates 242, each of which is provided with a second mounting region 242a and a third mounting region 242b on opposite sides thereof. Passive devices 262 of the electric devices 26 are mounted on the third mounting regions 242b. The outer housing 28 has two lateral plates 282, on each of which a protrusion portion 282a is provided and a receiving portion 282b in the protrusion portion 282a. The electric devices 26 on the third mounting regions 242b are received in the receiving portion 282b respectively and do not contact the outer housing 28 when the outer housing is mounted on the housing 22.

It is noted that distal ends of the protrusion portions 282a are lower than free ends of lock blocks 226, such that it will not increase the size of the LCD module 20.

Figure 13:
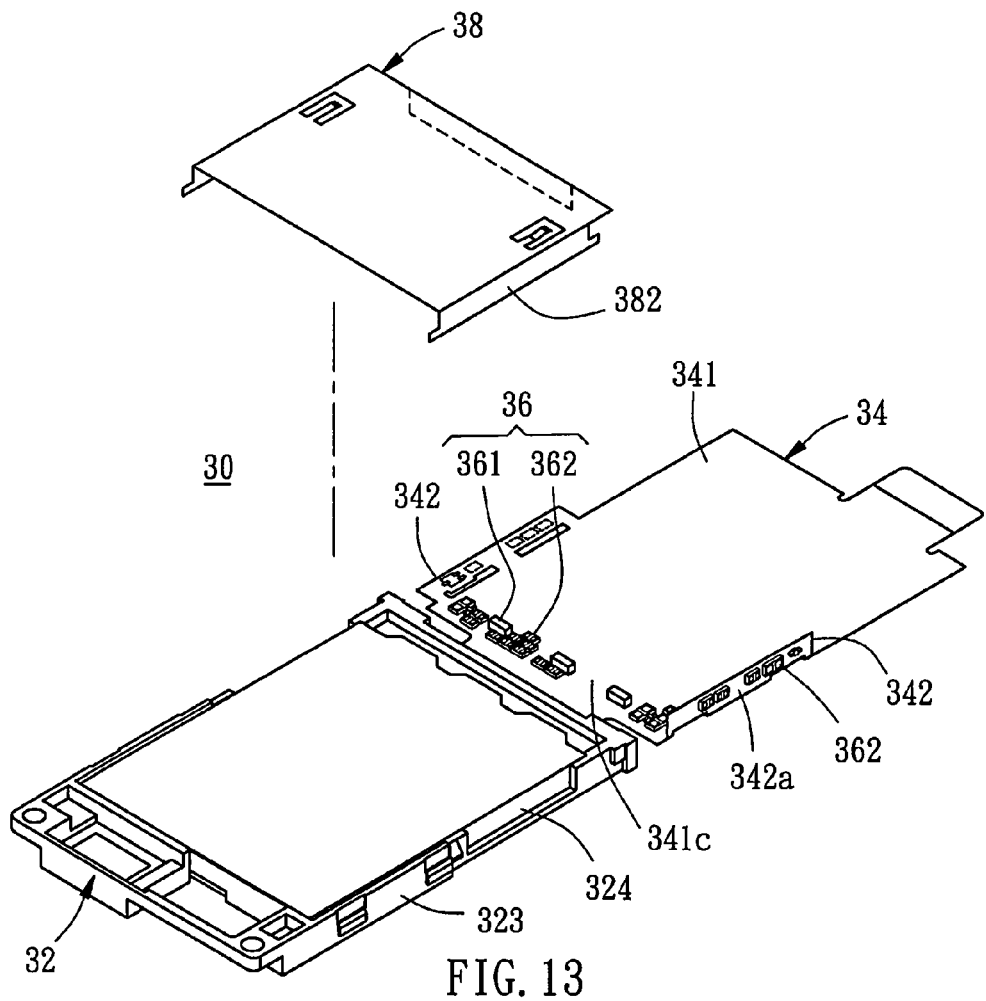
FIG. 13 is an exploded view of the LCD module of is a third preferred embodiment of the present invention.
Figure 14:
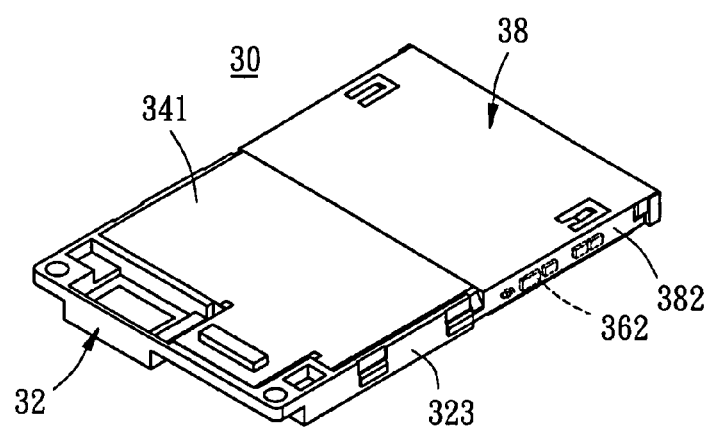
FIG. 14 is a combinative perspective view of FIG. 13.

FIG. 13 and FIG. 14 show a LCD module of the third preferred embodiment of the invention including a housing 32, a FPB 34, a plurality of electric deices 36 and an outer housing 38. The housing 32 has two opposite flat lateral sides, on each of which a receiving notch 324 is provided. The FPB 34 has a flexible substrate, on a front side of which a first mounting region 341a is provided to mount the electric devices 36, including LEDs 361 and passive devices 362, thereon, and two extension substrates 342, on a back side of which a second mounting region 342a is provided to mount passive devices 362. The extension substrates 342 are provided with no mounting region on front sides. When the extension substrates 342 are bent toward the flat lateral sides of the housing 32, the front sides of the extension substrates 342 is attached on the flat lateral sides respectively and the passive devices 362 on the second mounting regions 342a are lower than an outer circumference 323 of the housing 32 that the outer housing 38 may have flat lateral plates to reduce the size and still protect the passive devices 362 effectively.

Figure 15:
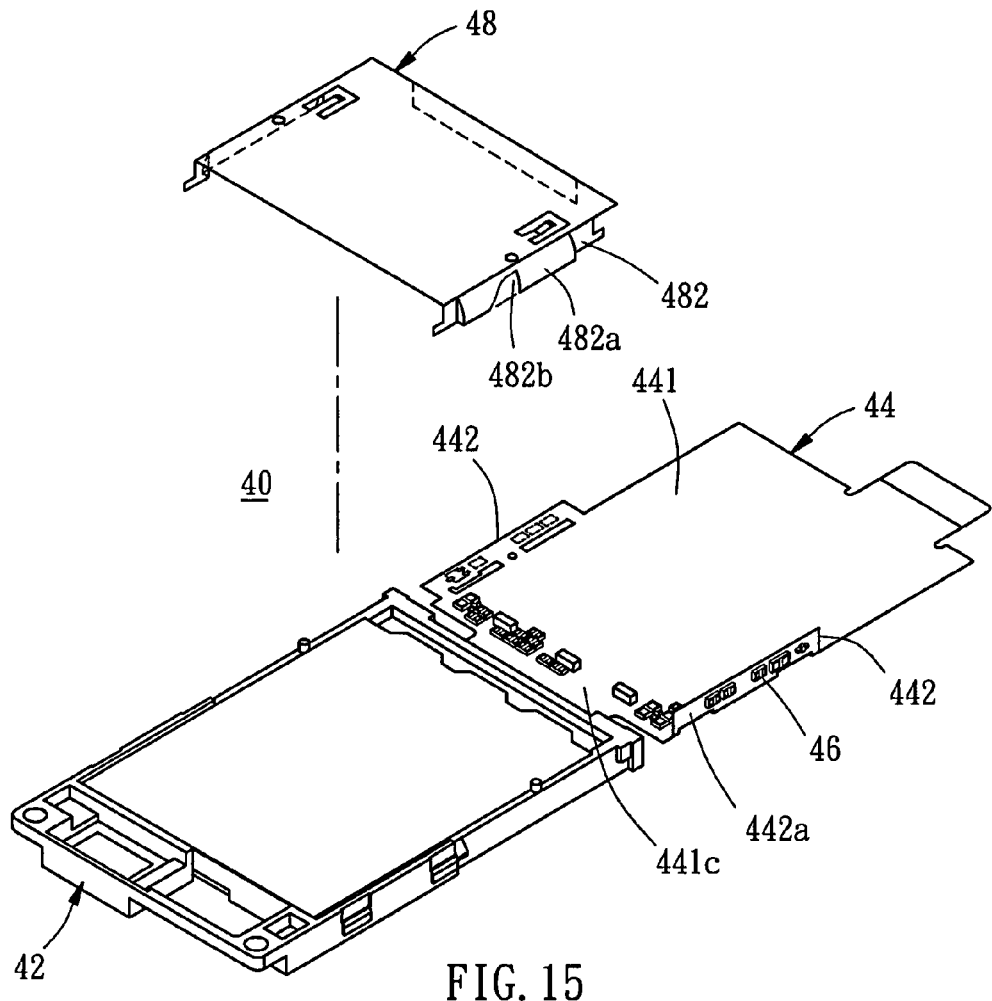
FIG. 15 is an exploded view of the LCD module of is a fourth preferred embodiment of the present invention.
Figure 16:
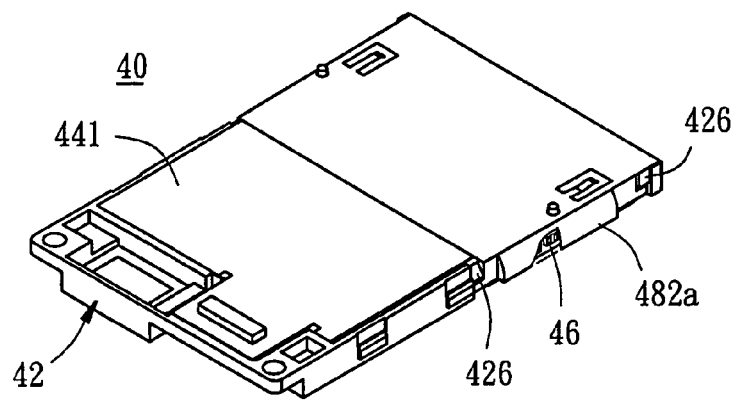
FIG. 16 is a combinative perspective view of FIG. 15.

FIG. 15 and FIG. 16 show a LCD module 40 of the fourth preferred embodiment of the invention, which is similar to the LCD module 30 of the third preferred embodiment, except that:

The LCD module 40 has a housing 42 without any receiving notch. A FBP 44 has a flexible substrate 441 with a first mounting region 441c on a front side thereof and two extension substrates 442 with a second mounting region 4421 on a back side thereof respectively. An outer housing 48 has two lateral plates 482, each of which has a protrusion portion 482b projected therefrom and a receiving portion 482b in the protrusion portion 482b to receive electric devices 46 on the second mounting regions 442a respectively. At the same time, distal ends of the protrusion portions 482a are lower than free ends of lock blocks 426 of the housing 42, such that it will not increase the size of the LCD module 40.

Figure 17:
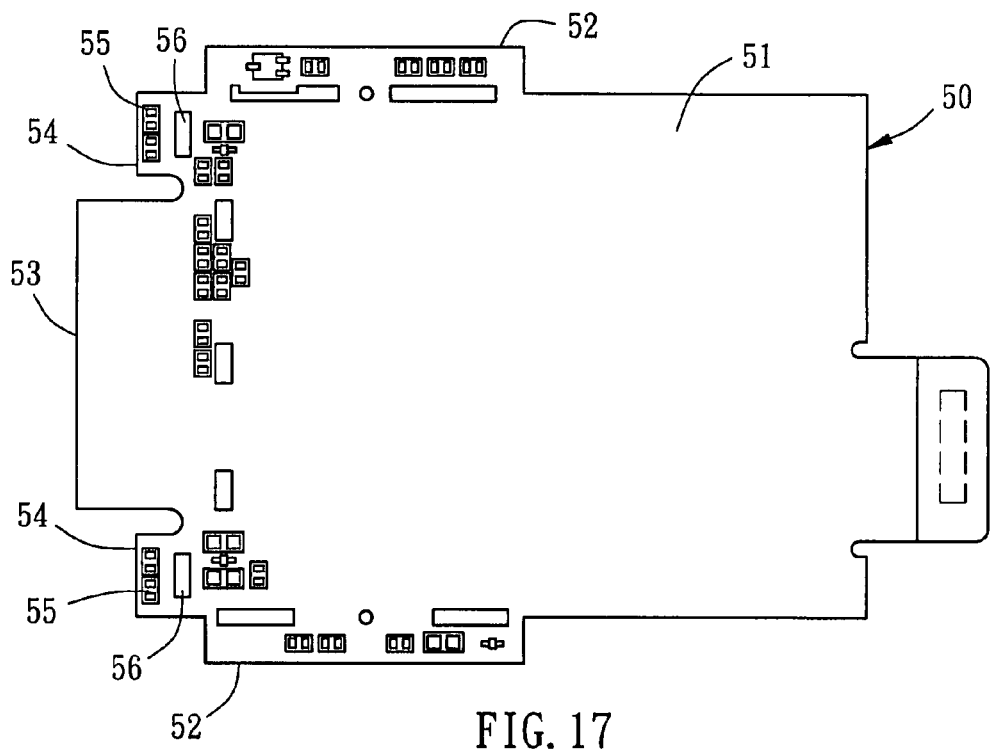
FIG. 17 is a sketch diagram of an alternate FPB.

Above are the alternate embodiments of the LCD modules of the present invention, which include the FPBs with various mounting regions and the housings for the specific FPB. It is noted that the extension substrates of the FPB have many alternate embodiments and are not limited in the drawings, such as FPBs 50 and 60 shown in FIG. 17 and FIG. 18. The FPBs 50 and 60 have a flexible substrate 51, 61 and two extension substrates 52, 62. The different parts are:

The FPB 50 of FIG. 17 has two sub-extension substrates 54 on an edge with a signal output terminal 53 to mount more electric devices 55 thereon. The FPB 50 has openings 56 at junctions of the sub-extension substrates 54 and the flexible substrate 51 to reduce the ejecting force of the sub-extension substrates 54 when the sub-extension substrates 54 are bent.

Figure 18:
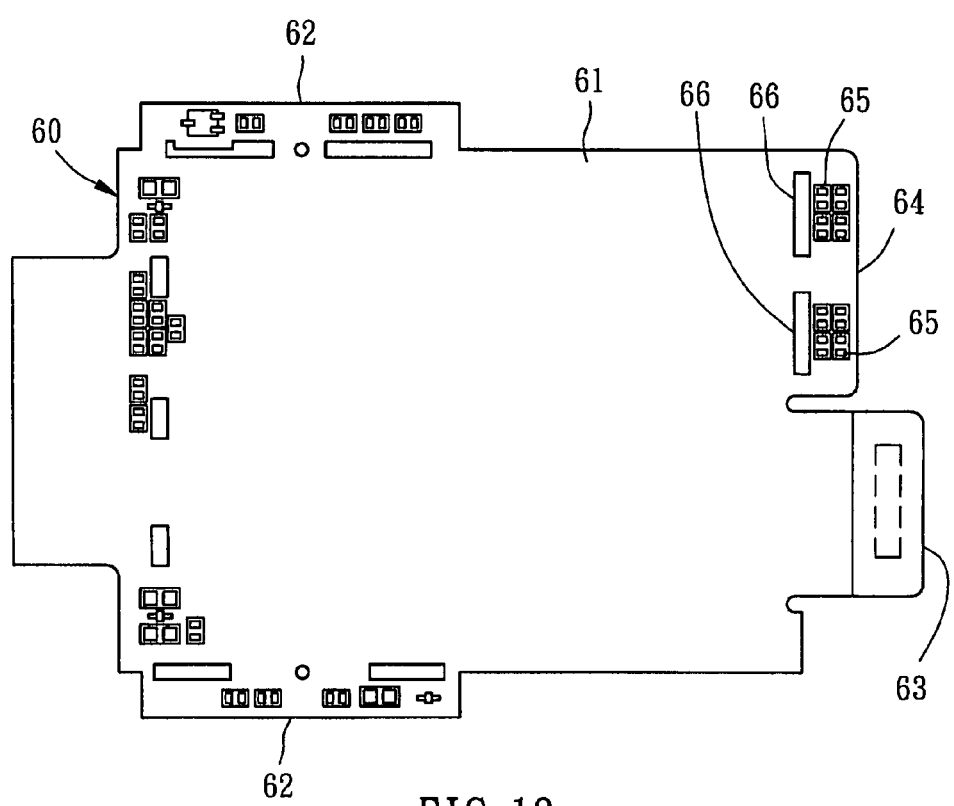
FIG. 18 is a sketch diagram of another alternate FPB.

The FPB 60 of FIG. 18 has a sub-extension substrate 64 on an edge with a signal input terminal 63 to mount more electric devices 65 thereon. The FPB 50 has openings 66 at a junction of the sub-extension substrate 54 and the flexible substrate 51 to reduce the ejecting force of the sub-extension substrate 54 when the sub-extension substrate 54 is bent.

The locations of the extension substrates and the sub-extension substrates are not limited. For the same principle, the LCD module equipped with the FPB 50 or 60 is provided with the housing with the receiving notches to receive the extension substrates and(or) the sub-extension substrates, or the outer housing is provided with the lateral plates with receiving portions to receive the electric devices. The description above is a few preferred embodiments of the present invention and the equivalence of the present invention is still in the scope of the claim of the present invention.

What is claimed is:

1. A liquid crystal display module, comprising:
   a housing having an enclosed outer circumference, on which at least a receiving notch is provided;
   a flexible printed circuit board having a flexible substrate and at least a extension substrate, the flexible substrate being mounted on the housing and having a signal input terminal, a signal output terminal and a first mounting region, the extension substrate having a second mounting region and being an protruding extension of the flexible substrate excluding the signal input terminal and the signal output terminal;
   a plurality of electric devices mounted on the first mounting region and the second mounting region of the flexible printed circuit board respectively; and
   wherein the extension substrate is folded in a predetermined angle with respect to the flexible substrate and the electric devices mounted on the second mounting region are received in the receiving notch of the housing.

2. The liquid crystal display module as defined in claim 1, wherein the first mounting region facing the housing, and the second mounting region facing the outer circumference of the housing.

3. The liquid crystal display module as defined in claim 2, further comprising an outer housing having a lateral plate covering the receiving notch and the extension substrate.

4. The liquid crystal display module as defined in claim 2, wherein the extension substrate has a third mounting region on a side opposite to the second mounting region to mount electric devices.

5. The liquid crystal display module as defined in claim 4, further comprising an outer housing having a lateral plate covering the extension substrate, wherein the lateral plate is provided with a receiving portion for receiving the electric devices on the third mounting region of the extension substrate.

6. The liquid crystal display module as defined in claim 1, wherein the flexible substrate has the first mounting region facing the housing, and the extension substrate has the second mounting region opposite to the outer circumference of the housing.

7. The liquid crystal display module as defined in claim 6, further comprising an outer housing having a lateral plate covering the extension substrate and attached on the extension substrate.

8. The liquid crystal display module as defined in claim 1, wherein the flexible printed circuit board is provided with at least an opening at a junction of the flexible substrate and the extension substrate.

9. A liquid crystal display module, comprising:
   a housing having an enclosed outer circumference;
   a flexible printed circuit board having a flexible substrate and at least an extension substrate;
   wherein the flexible substrate is mounted on the housing and has a signal input terminal, a signal output terminal and a first mounting region, and the extension substrate protrudes from the flexible substrate excluding the signal input terminal and the signal output terminal and has a second mounting region;
   wherein the extension substrate is attached on the outer circumference of the housing;
   a plurality of electric devices mounted on the first mounting region and the second mounting region of the flexible printed circuit board respectively; and
   an outer housing having at least a lateral plate attached on the housing and a receiving portion covering the second mounting region of the extension substrate to receive the electric devices on the second mounting region therein.

10. The liquid crystal display module as defined in claim 9, wherein the flexible printed circuit board has at least an opening at a junction of the flexible substrate and the extension substrate.

* * * * *